United States Patent
Yamada et al.

(10) Patent No.: US 8,952,477 B2
(45) Date of Patent: Feb. 10, 2015

(54) PHOTOELECTRIC CONVERSION ELEMENT HAVING A PLURALITY OF LAYERED SEMICONDUCTORS AND METHOD FOR MANUFACTURING SAME

(75) Inventors: Yasuhiro Yamada, Kanagawa (JP); Tsutomu Tanaka, Kanagawa (JP); Makoto Takatoku, Kanagawa (JP); Ryoichi Ito, Aichi (JP)

(73) Assignee: Sony Corporation, Tokyo (JP)

( * ) Notice: Subject to any disclaimer, the term of this patent is extended or adjusted under 35 U.S.C. 154(b) by 105 days.

(21) Appl. No.: 13/196,096

(22) Filed: Aug. 2, 2011

(65) Prior Publication Data

US 2012/0038018 A1 Feb. 16, 2012

(30) Foreign Application Priority Data

Aug. 10, 2010 (JP) ................. 2010-179555

(51) Int. Cl.
*H01L 31/102* (2006.01)
*H01L 31/0352* (2006.01)
*H01L 27/146* (2006.01)
*H01L 31/105* (2006.01)

(52) U.S. Cl.
CPC ...... *H01L 31/0352* (2013.01); *H01L 27/14663* (2013.01); *H01L 31/105* (2013.01); *H01L 27/14607* (2013.01); *H01L 27/14692* (2013.01)
USPC .......................................... 257/458

(58) Field of Classification Search
CPC ............... H01L 27/14607; H01L 27/14663; H01L 27/14692; H01L 31/0352; H01L 31/105
USPC ..................................... 257/E31.061
See application file for complete search history.

(56) References Cited

U.S. PATENT DOCUMENTS

2006/0001120 A1* 1/2006 Wright ...................... 257/452

FOREIGN PATENT DOCUMENTS

JP 2000-156522 6/2000

* cited by examiner

*Primary Examiner* — Kimberly Rizkallah
*Assistant Examiner* — Alexander Belousov
(74) *Attorney, Agent, or Firm* — Dentons US LLP

(57) ABSTRACT

A photoelectric conversion element includes a first semiconductor layer that exhibits a first conductivity type and is provided in a selective area over a substrate, a second semiconductor layer that exhibits a second conductivity type and is disposed opposed to the first semiconductor layer, and a third semiconductor layer that is provided between the first and second semiconductor layers and exhibits a substantially intrinsic conductivity type. The third semiconductor layer has at least one corner part that is not in contact with the first semiconductor layer.

8 Claims, 17 Drawing Sheets

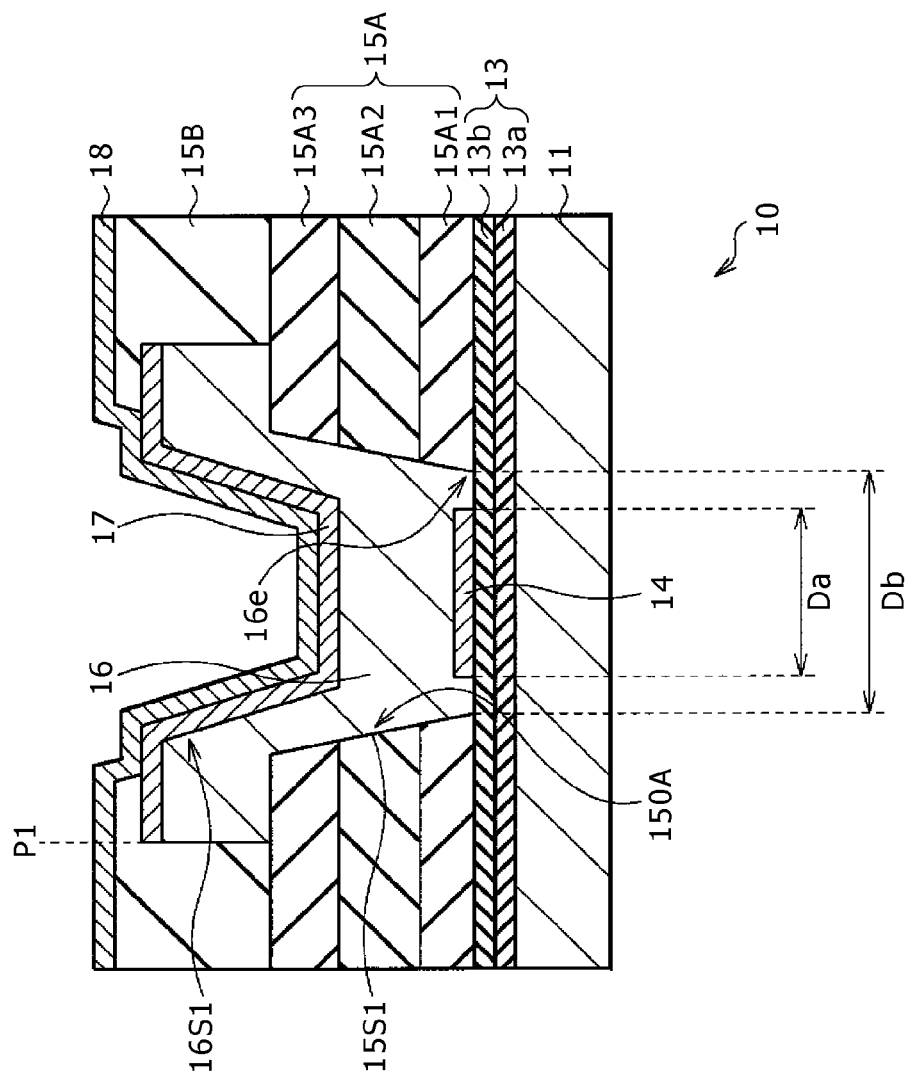

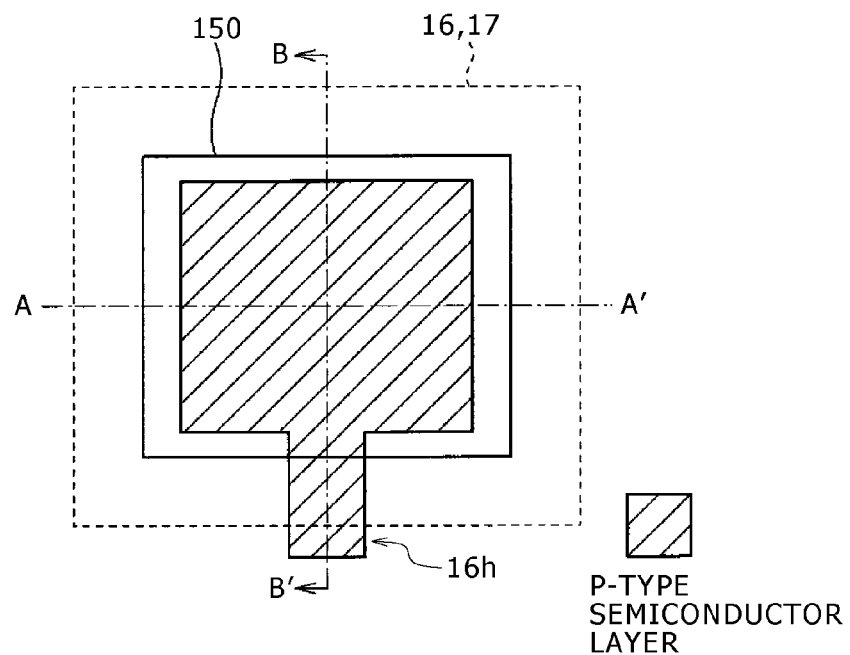
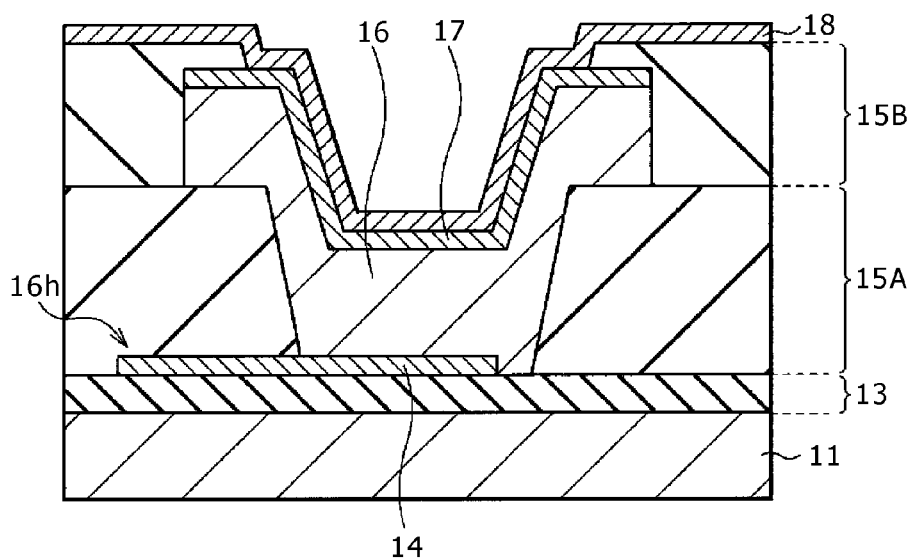

PHOTOELECTRIC CONVERSION ELEMENT HAVING A PLURALITY OF LAYERED SEMICONDUCTORS AND METHOD FOR MANUFACTURING SAME

BACKGROUND

The present disclosure relates to a photoelectric conversion element such as a PIN photodiode used for e.g. radiation imaging device and optical touch sensor, and a method for manufacturing the same.

The PIN photodiode is used as a photoelectric conversion element in radiation imaging device, optical touch panel, etc. This PIN (Positive Intrinsic Negative) photodiode has a structure in which a so-called i-type semiconductor layer is interposed between a p-type semiconductor layer and an n-type semiconductor layer, and a signal charge with the amount of charge dependent on the amount of incident light can be extracted.

Such a photodiode is desired to have further enhanced optical sensitivity and various proposals have been made for this desire (refer to e.g. Japanese Patent Laid-open No. 2000-156522). This patent document discloses a photoelectric conversion device in which a semiconductor layer in the photoelectric converter is extended to the transistor part and this extended part is used as a light blocking layer to thereby ensure a high aperture ratio and enhance the pattern accuracy to achieve enhanced sensitivity.

SUMMARY

However, in the above-described PIN photodiode, the i-type semiconductor layer is so provided as to be extended from the inside of a hole made in the interlayer insulating film to the top surface of the interlayer insulating film. Thus, stress is applied to the i-type semiconductor layer due to the shape of the hole (step of sidewall part) and a crack is generated. In particular, this stress becomes higher if the film thickness of the i-type semiconductor layer is increased in order to enhance the optical sensitivity. Such a crack has a problem of acting as a leakage path and increasing the dark current.

There is a need for a technique to provide a photoelectric conversion element capable of suppressing increase in the dark current attributed to a crack, and a method for manufacturing the same.

According to an embodiment of the present disclosure, there is provided a photoelectric conversion element including a first semiconductor layer configured to exhibit a first conductivity type and be provided in a selective area over a substrate, a second semiconductor layer configured to exhibit a second conductivity type different from the first conductivity type and be disposed opposed to the first semiconductor layer, and a third semiconductor layer configured to be provided between the first and second semiconductor layers and exhibit a substantially intrinsic conductivity type. The third semiconductor layer has at least one corner part that is not in contact with the first semiconductor layer.

According to another embodiment of the present disclosure, there is provided a method for manufacturing a photoelectric conversion element. The method includes forming a first semiconductor layer exhibiting a first conductivity type in a selective area over a substrate, and forming a third semiconductor layer on the first semiconductor layer. The third semiconductor layer has at least one corner part that is not in contact with the first semiconductor layer, and exhibits a substantially intrinsic conductivity type. The method further includes forming a second semiconductor layer exhibiting a second conductivity type on the third semiconductor layer.

According to the photoelectric conversion element and the method for manufacturing a photoelectric conversion element in accordance with the embodiments of the present disclosure, if a crack is generated in the third semiconductor layer due to the influence of stress attributed to e.g. the shape of the third semiconductor layer, the crack tends to be so generated that its start point (or end point) is the corner part of the third semiconductor layer because the third semiconductor layer has the corner part. Because such a corner part is not in contact with the first semiconductor layer, acting of the generated crack as a leakage path is suppressed. Alternatively, the occurrence itself of the crack is suppressed.

According to the photoelectric conversion element and the method for manufacturing a photoelectric conversion element in accordance with the embodiments of the present disclosure, the third semiconductor layer provided between the first and second semiconductor layers has the corner part that is not in contact with the first semiconductor layer. Thus, for example when a crack is generated in the third semiconductor layer, acting of the crack as a leakage path can be suppressed. Alternatively, the occurrence itself of the crack can be suppressed. This can suppress increase in the dark current attributed to the crack.

BRIEF DESCRIPTION OF THE DRAWINGS

FIG. 1 is a sectional view showing the configuration of a photoelectric conversion element according to one embodiment of the present disclosure;

FIG. 2 is a schematic diagram showing the planar configuration of a p-type semiconductor layer, an i-type semiconductor layer (n-type semiconductor layer), and a hole part of the photoelectric conversion element shown in FIG. 1;

FIG. 3 is a sectional view showing the configuration of the photoelectric conversion element along line B-B' shown in FIG. 2;

FIG. 10A is a sectional view along line A-A' and FIG. 10B is a sectional view along line B-B';

FIG. 11A shows the comparative example and FIG. 11B shows the embodiment;

DETAILED DESCRIPTION OF THE PREFERRED EMBODIMENT

Figure 4A:
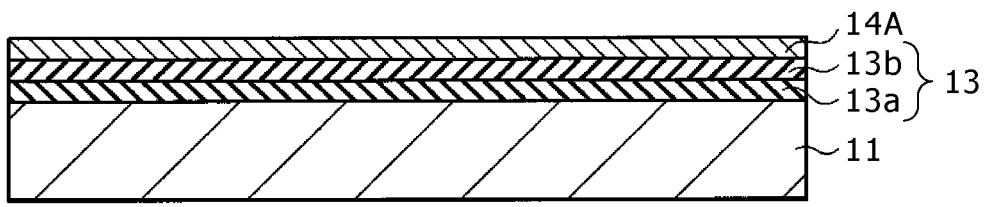
FIGS. 4A to 4C are sectional views for explaining a method for manufacturing the photoelectric conversion element shown in FIG. 1.

Modes for carrying out the present disclosure will be described below with reference to the drawings. The order of the description is as follows.
1. Embodiment (example in which i-type semiconductor layer is so formed as to range from inside of contact hole to top surface of first interlayer insulating film)
2. Modification Examples 1 and 2 (example in which contact hole is formed by two-step etching)
3. Modification Examples 3 and 4 (example in which i-type semiconductor layer is patterned in contact hole)
4. Application Example (example of photoelectric conversion device and radiation imaging device using photoelectric conversion element)

Embodiment

FIG. 1 shows the schematic configuration of a photoelectric conversion element 10 according to one embodiment of the present disclosure. The photoelectric conversion element 10 is a PIN (Positive Intrinsic Negative) photodiode obtained by interposing a non-doped i-type semiconductor layer (intrinsic semiconductor layer) between a p-type semiconductor layer and an n-type semiconductor layer.

[Whole Configuration of Photoelectric Conversion Element 10]

The photoelectric conversion element 10 has a p-type semiconductor layer 14 (first semiconductor layer) in a selective area over a substrate 11 composed of e.g. glass with the intermediary of an insulating film 13. Over the substrate 11 (specifically, on the insulating film 13), a first interlayer insulating film 15A having a contact hole 150A (through-hole) opposed to the p-type semiconductor layer 14 is provided. An i-type semiconductor layer 16 (third semiconductor layer) is provided on the p-type semiconductor layer 14 in the contact hole 150A of the first interlayer insulating film 15A, and an n-type semiconductor layer 17 (second semiconductor layer) is formed on this i-type semiconductor layer 16. An upper electrode 18 is connected to the n-type semiconductor layer 17 via a contact hole 150B of a second interlayer insulating film 15B. FIG. 2 is a schematic plan view showing the forming area of the p-type semiconductor layer 14, the contact hole 150A, and the i-type semiconductor layer 16 (n-type semiconductor layer 17). FIG. 1 is equivalent to a sectional view along line A-A' in FIG. 2. FIG. 3 is an arrow sectional view along line B-B' in FIG. 2.

For the present embodiment, the case in which the p-type semiconductor layer 14 is provided on the substrate side (lower side) and the n-type semiconductor layer 17 is provided on the upper side will be described below. However, the reverse structure, i.e. a structure in which the n-type semiconductor layer is provided on the lower side (substrate side) and the p-type semiconductor layer is provided on the upper side, may be employed.

The insulating film 13 is obtained by stacking insulating films such as a SiNx layer 13a and a $SiO_2$ layer 13b. For example if the photoelectric conversion element 10 is used in each pixel in e.g. an imaging device, this insulating film 13 may be formed as the same layer as the gate insulating film in various kinds of transistors. The thickness of the SiNx layer 13a is e.g. 50 nm and the thickness of the $SiO_2$ layer 13b is e.g. 10 nm to 120 nm.

The p-type semiconductor layer 14 is a p+ region made by doping e.g. polycrystalline silicon (polysilicon) or microcrystalline silicon with e.g. boron (B) and has a thickness of e.g. 40 nm to 50 nm. This p-type semiconductor layer 14 serves also as e.g. a lower electrode (anode) for reading out a signal charge and is connected to a lower extraction interconnect 16h.

The first interlayer insulating film 15A is obtained by stacking insulating films, i.e. a $SiO_2$ layer 15A1, a SiNx layer 15A2, and a $SiO_2$ layer 15A3, for example. For example if the photoelectric conversion element 10 is used in each pixel in e.g. an imaging device, this first interlayer insulating film 15A may be formed as the same layer as an interlayer insulating film in various kinds of transistors. The thickness of the $SiO_2$ layer 15A1 is e.g. 150 nm. The thickness of the SiNx layer 15A2 is e.g. 300 nm. The thickness of the $SiO_2$ layer 15A3 is e.g. 200 nm.

In such a first interlayer insulating film 15A, the contact hole 150A is made by etching. In the present embodiment, the contact hole 150A is formed by a one-step etching process. That is, the shape of a wall surface 15S1 of the contact hole 150A is a straight line shape in a section along the direction perpendicular to the substrate surface. In other words, the wall surface 15S1 is a flat surface having no corner (protrusion). This wall surface 15S1 may be an inclined surface as shown in FIG. 1 or may be a surface perpendicular to the substrate surface.

The i-type semiconductor layer 16 is a semiconductor layer exhibiting a substantially intrinsic conductivity type, e.g. a non-doped intrinsic semiconductor layer, and is composed of e.g. non-crystalline silicon (amorphous silicon). The thickness of the i-type semiconductor layer 16 is e.g. 400 nm to 1000 nm. When this thickness is larger, the optical sensitivity can be enhanced to a larger extent. The details of the configuration of this i-type semiconductor layer 16 will be described later.

The n-type semiconductor layer 17 is composed of e.g. non-crystalline silicon (amorphous silicon) and forms an n+ region. The thickness of this n-type semiconductor layer 17 is e.g. 10 nm to 50 nm.

The upper electrode 18 is an electrode for supplying a reference potential for photoelectric conversion and is formed of a transparent electrically-conductive film of e.g. indium tin oxide (ITO). This upper electrode 18 is connected to a power supply line (not shown). The second interlayer insulating film 15B is composed of e.g. $SiO_2$ and has a thickness of e.g. 400 nm.

(Details of Configuration of i-Type Semiconductor Layer 16)

In the present embodiment, the i-type semiconductor layer 16 is so provided as to be extended from the inside of the contact hole 150A in the first interlayer insulating film 15A to the top surface of the first interlayer insulating film 15A (specifically, to a position p1). In other words, part of the i-type semiconductor layer 16 overlaps with (is superimposed on) the top surface of the first interlayer insulating film 15A. Furthermore, the i-type semiconductor layer 16 has a step structure (16S1) dependent on the step of the first interlayer insulating film 15A (difference in height of the wall surface of the contact hole 150A). As described in detail later, due to this step structure 16S1, stress arises in (stress is applied to) the i-type semiconductor layer 16 and generation of a crack is facilitated.

Such an i-type semiconductor layer 16 is provided along the shape of the wall surface 15S1 of the contact hole 150A of the first interlayer insulating film 15A. That is, the surface (side surface) of the i-type semiconductor layer 16 on the side of the first interlayer insulating film 15A has the surface shape dependent on the above-described shape of the wall surface 15S1 and is a flat surface in the present embodiment.

Furthermore, the i-type semiconductor layer 16 has a corner part 16e that is not in contact with the p-type semiconductor layer 14 in the surface on the side of the substrate 11 (surface on the opposite side to the n-type semiconductor layer 17). This corner part 16e is equal to the part corresponding to the end edge on the side of the substrate 11 in the present embodiment, in which the side surface of the i-type semiconductor layer 16 is a flat surface. Such a structure is equivalent to that the lower-side opening of the contact hole 150A is so made as to surround the outside of the forming area of the p-type semiconductor layer 14 in the direction along the substrate surface. That is, width Da of the p-type semiconductor layer 14 is smaller than width Db of the lower-side opening of the contact hole 150A.

[Method for Manufacturing Photoelectric Conversion Element 10]

The photoelectric conversion element 10 can be manufactured in the following manner for example. FIGS. 4A to 8B are sectional views for explaining a method for manufacturing the photoelectric conversion element 10 in the step order.

First, as shown in FIG. 4A, the insulating film 13 is formed on the substrate 11 by depositing the SiNx layer 13a and the $SiO_2$ layer 13b in that order by e.g. chemical vapor deposition (CVD). On the formed insulating film 13, an amorphous silicon (α-Si) layer 14A is deposited by e.g. CVD.

Figure 4B:
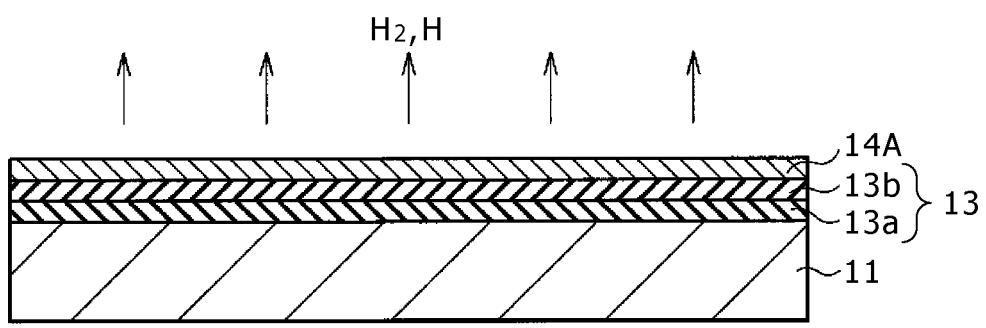
Figure 4C:
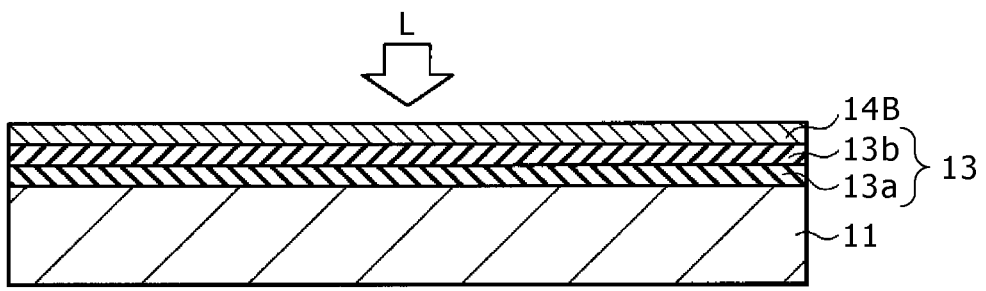

Subsequently, as shown in FIG. 4B, dehydrogenation annealing treatment is performed at a temperature of e.g. 400° C. to 450° C. Thereafter, as shown in FIG. 4C, the α-Si layer 14A is turned to polysilicon by irradiating it with e.g. laser light L having a wavelength of 308 nm by e.g. excimer laser annealing (ELA). Thereby, a polysilicon (p-Si) layer 14B is formed on the insulating film 13.

Figure 5A:
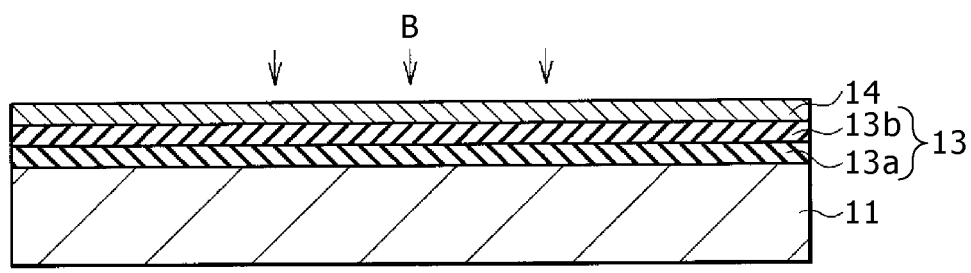
FIGS. 5A to 5C are sectional views showing steps subsequent to FIGS. 4A to 4C.
Figure 5B:
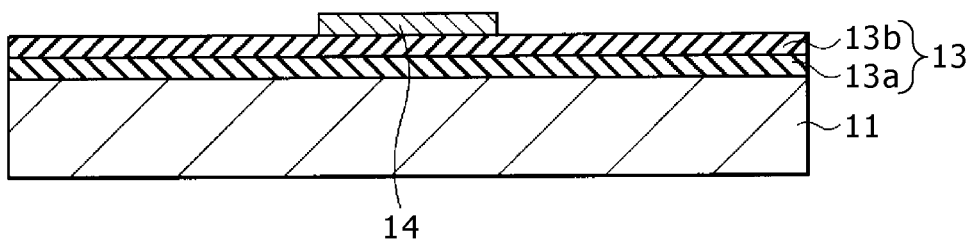

Subsequently, as shown in FIG. 5A, the formed p-Si layer 14B is doped with e.g. boron (B) ions by e.g. ion implantation. Thereby, the p-type semiconductor layer 14 to serve as a p+ region is formed on the insulating film 13. Thereafter, as shown in FIG. 5B, the p-type semiconductor layer 14 is patterned by e.g. photolithography.

Figure 5C:
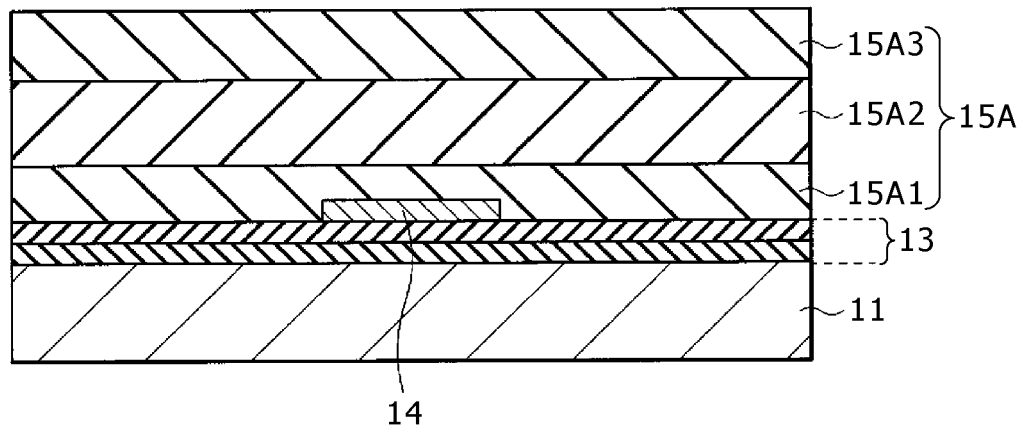

Subsequently, as shown in FIG. 5C, the $SiO_2$ layer 15A1, the SiNx layer 15A2, and the $SiO_2$ layer 15A3 are deposited in that order by e.g. CVD over the whole surface of the substrate 11 over which the p-type semiconductor layer 14 is formed. This forms the first interlayer insulating film 15A.

Figure 6A:
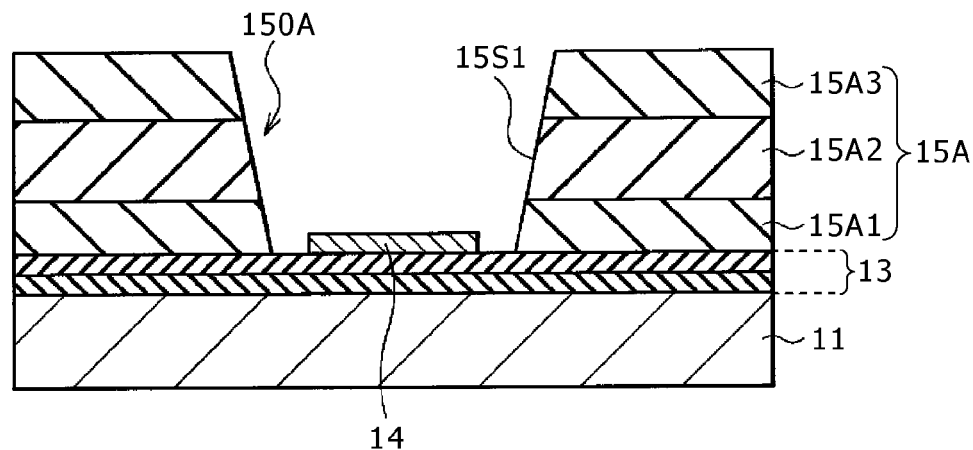
FIGS. 6A and 6B are sectional views showing steps subsequent to FIGS. 5A to 5C.

Subsequently, as shown in FIG. 6A, the contact hole 150A is formed in the area of the first interlayer insulating film 15A opposed to the p-type semiconductor layer 14 by e.g. photolithography. In this step, in the present embodiment, three layers in the first interlayer insulating film 15A, i.e. the $SiO_2$ layer 15A1, the SiNx layer 15A2, and the $SiO_2$ layer 15A3, are removed by one time (one step) of etching process such as dry etching. Thereby, the contact hole 150A having the flat wall surface 15S1 is formed. At this time, the etching is so performed that the lower-side opening of the contact hole 150A becomes larger than the p-type semiconductor layer 14 (surrounds the outside of the p-type semiconductor layer 14). This allows the above-described corner part 16e to be made in the i-type semiconductor layer 16 to be formed in the next step.

Figure 6B:
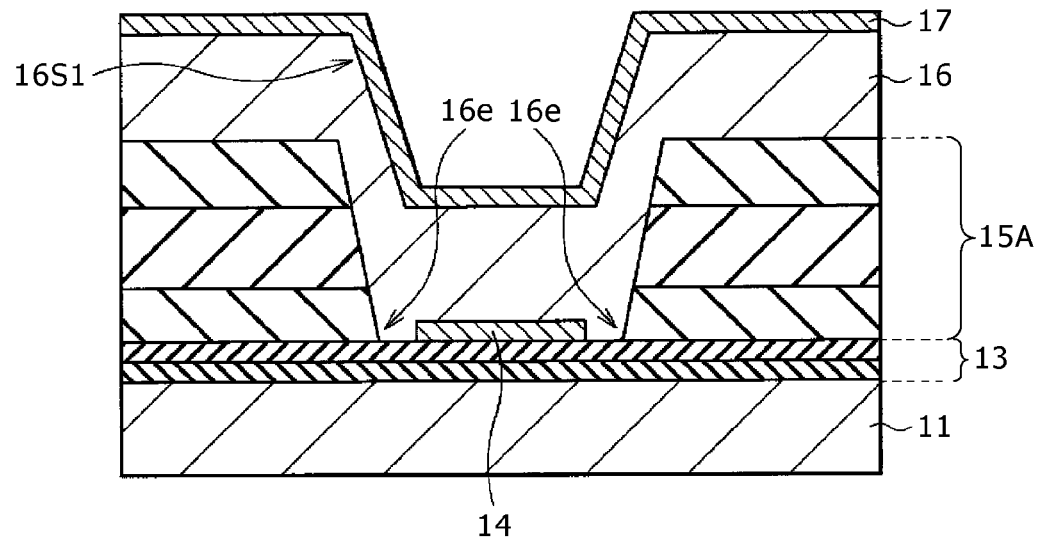

Subsequently, as shown in FIG. 6B, the i-type semiconductor layer 16 and the n-type semiconductor layer 17 are deposited in that order over the first interlayer insulating film 15A by e.g. CVD in such a manner as to fill the contact hole 150A. Thereby, the step structure 16S1 dependent on the difference in height of the contact hole 150A is formed in the i-type semiconductor layer 16. The n-type semiconductor layer 17 is formed in accordance with the surface shape of the i-type semiconductor layer 16 having such a step structure 16S1.

Figure 7A:
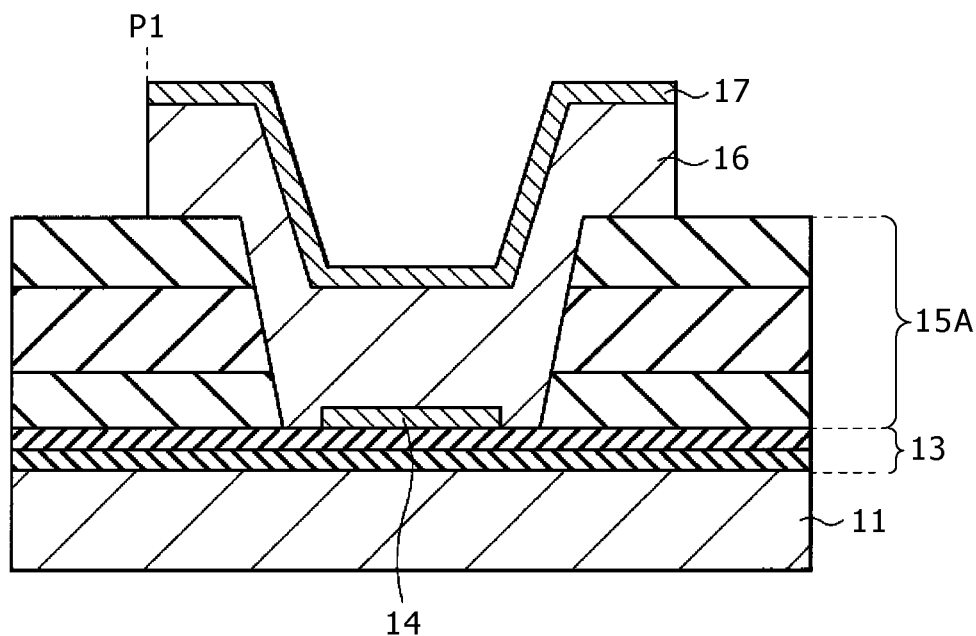
FIGS. 7A and 7B are sectional views showing steps subsequent to FIGS. 6A and 6B.

Subsequently, as shown in FIG. 7A, the formed i-type semiconductor layer 16 and n-type semiconductor layer 17 are patterned into a predetermined shape by e.g. photolithography. At this time, the i-type semiconductor layer 16 and the n-type semiconductor layer 17 are so patterned as to overlap with the first interlayer insulating film 15A in the range to the predetermined position p1 on the first interlayer insulating film 15A. In this patterning, the $SiO_2$ layer 15A3 in the first interlayer insulating film 15A functions as an etching stopper layer.

Figure 7B:
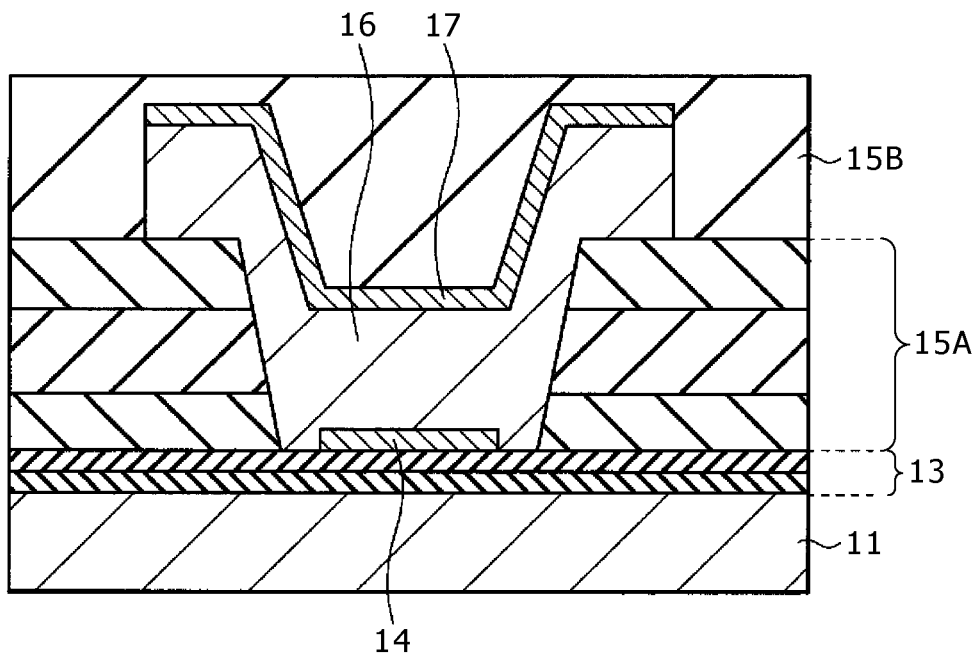

Subsequently, as shown in FIG. 7B, the second interlayer insulating film 15B is deposited over the whole surface of the substrate 11 by e.g. CVD.

Figure 8A:
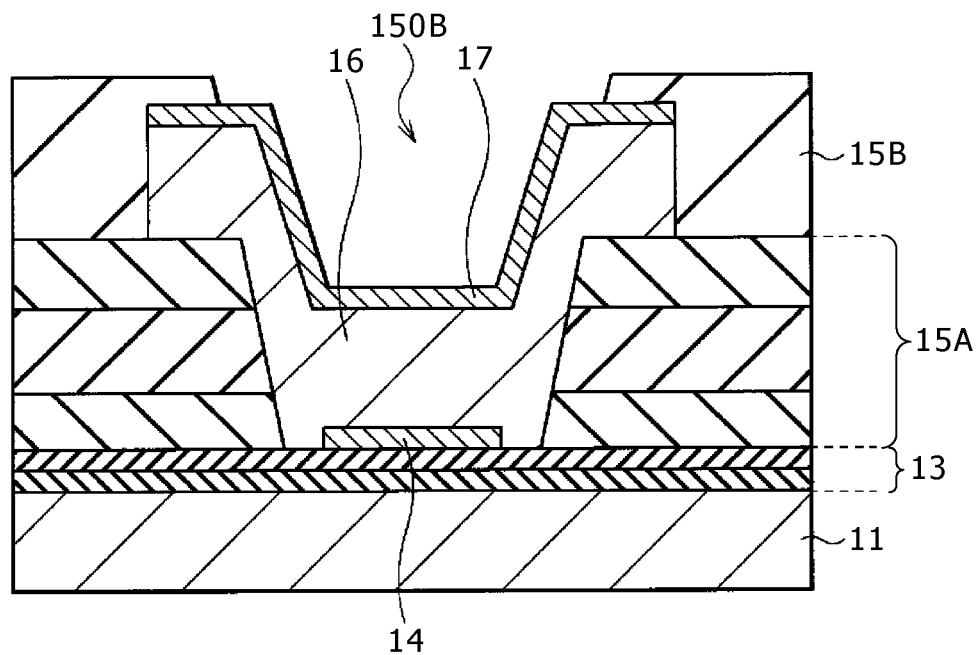
FIGS. 8A and 8B are sectional views showing steps subsequent to FIGS. 7A and 7B.
Figure 8B:
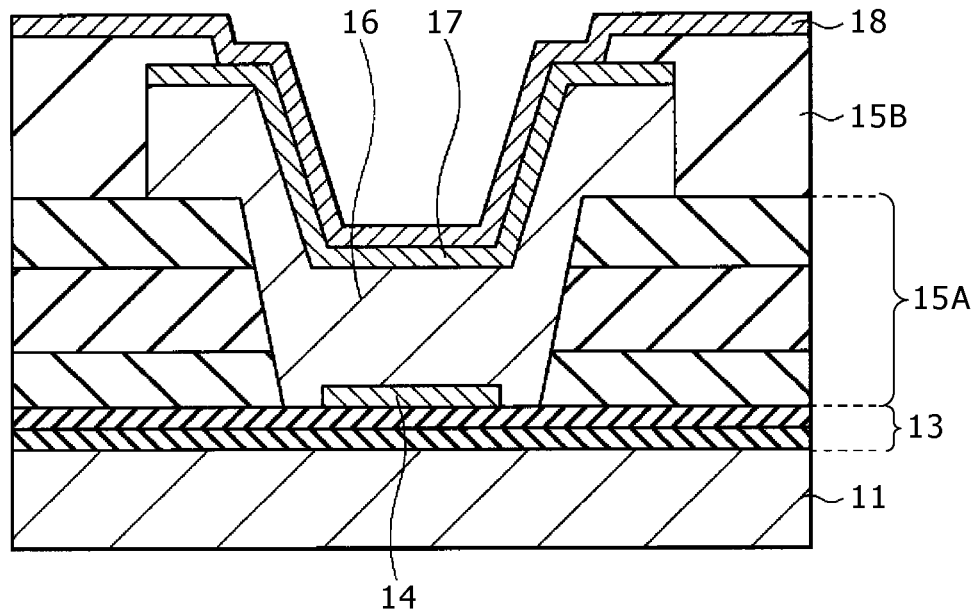

Subsequently, as shown in FIG. 8A, the contact hole 150B is formed in the area of the second interlayer insulating film 15B opposed to the n-type semiconductor layer 17 by e.g. photolithography. Thereafter, as shown in FIG. 8B, the upper electrode 18 is deposited by e.g. sputtering, and thereby the photoelectric conversion element 10 shown in FIG. 1 is completed.

[Operation and Effect of Photoelectric Conversion Element 10]

In the photoelectric conversion element 10, when a predetermined potential is applied from the power supply line (not shown) via the upper electrode 18, e.g. light incident from the side of the upper electrode 18 is converted to a signal charge with the amount of charge dependent on the amount of received light (photoelectric conversion). The signal charge generated by this photoelectric conversion is extracted as a photocurrent from the side of the p-type semiconductor layer 14.

In this photoelectric conversion element 10, the i-type semiconductor layer 16 is so provided as to be extended from the inside of the contact hole 150A to the top surface of the first interlayer insulating film 15A as described above. Thus, the i-type semiconductor layer 16 has the step structure 16S1 dependent on the difference in height of the wall surface 15S1 of the contact hole 150A. If the i-type semiconductor layer 16 has such a step structure 16S1, stress is applied to the i-type semiconductor layer 16 and a crack (seam) is easily generated at e.g. the edge part of the step structure 16S1. As described above, to enhance the optical sensitivity, it is preferable to increase the film thickness of the i-type semiconductor layer 16. However, as the film thickness is increased, the difference in height of the wall surface 15S1 becomes larger (difference in height of the step structure 16S1 becomes larger) and thus a crack is generated more easily.

Figure 9:
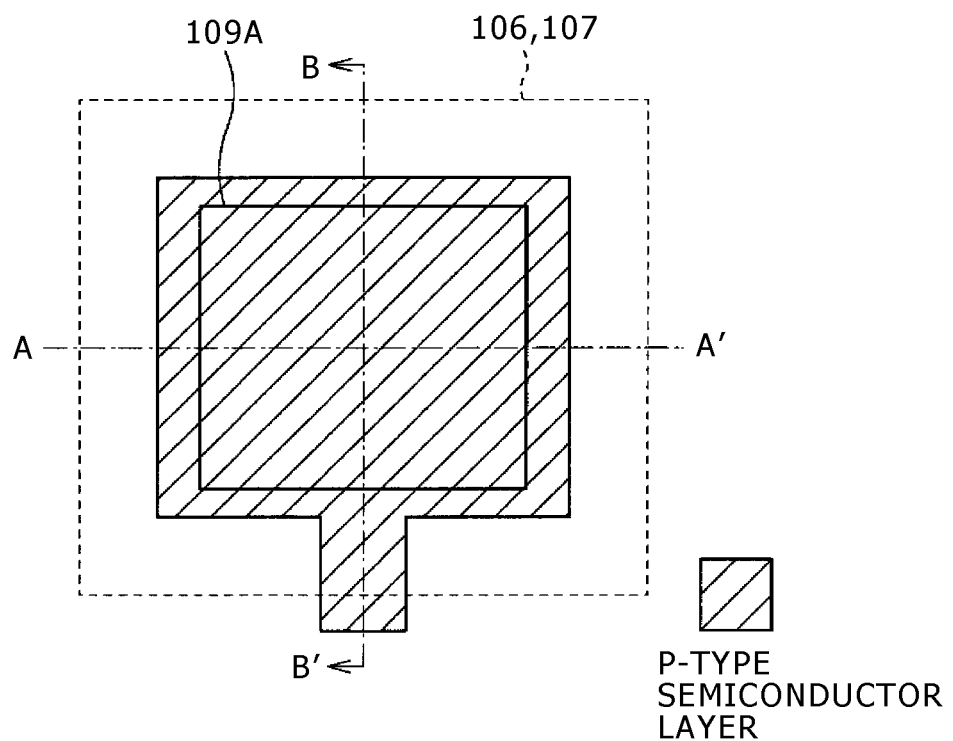
FIG. 9 is a schematic diagram showing the planar configuration of a p-type semiconductor layer, an i-type semiconductor layer (n-type semiconductor layer), and a hole part according to a comparative example.
Figure 10A:
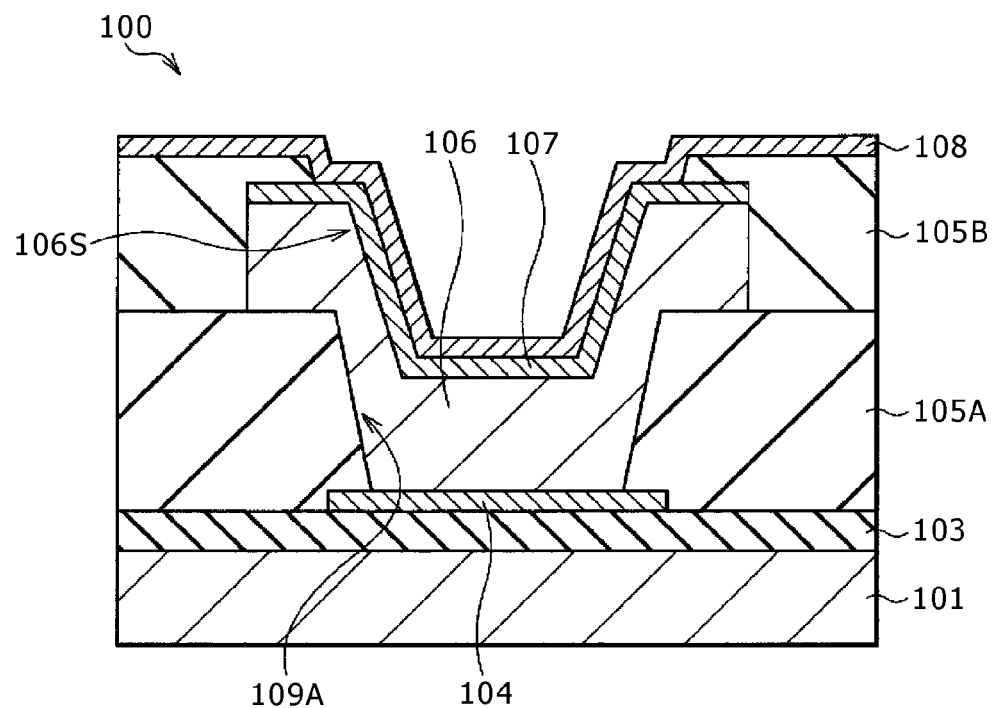
FIGS. 10A and 10B show the sectional configuration of the photoelectric conversion element shown in FIG. 9.
Figure 10B:
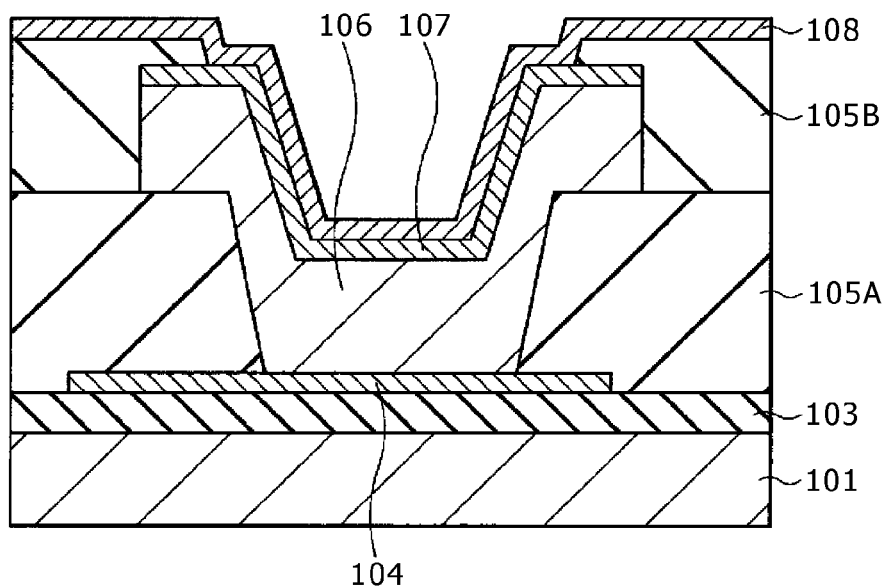

The influence of the above-described crack in a photoelectric conversion element according to a comparative example (photoelectric conversion element 100) will be described below. FIG. 9 is a schematic plan view showing the forming area of a p-type semiconductor layer 104, a contact hole 109A, and an i-type semiconductor layer 106 (n-type semiconductor layer 107) in the photoelectric conversion element 100. FIG. 10A is a sectional view along line A-A' in FIG. 9. FIG. 10B is an arrow sectional view along line B-B'. The photoelectric conversion element 100 has the p-type semiconductor layer 104 in a selective area over a substrate 101 with the intermediary of an insulating film 103, and a first interlayer insulating film 105A having the contact hole 109A opposed to the p-type semiconductor layer 104 is provided on the p-type semiconductor layer 104. The i-type semiconductor layer 106 and the n-type semiconductor layer 107 are provided in the area corresponding to the contact hole 109A, and the i-type semiconductor layer 106 has a step 106S in its top surface.

Figure 11A:
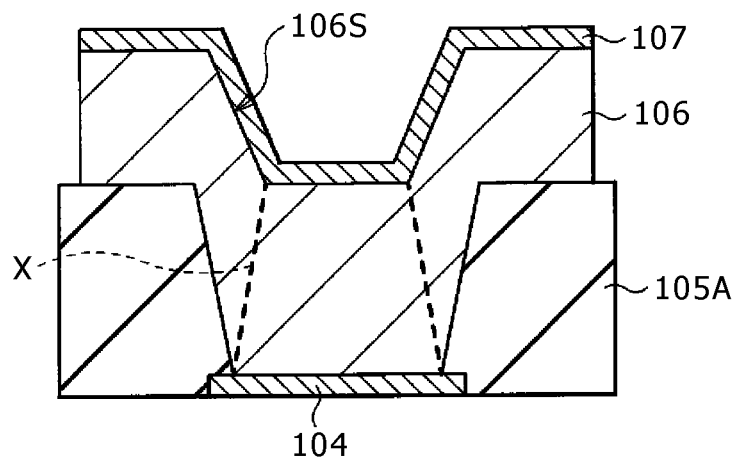
FIGS. 11A and 11B are schematic diagrams for explaining a crack generated in the i-type semiconductor layer.

In the above-described photoelectric conversion element 100 of the comparative example, a crack X like that shown in FIG. 11A is generated due to stress attributed to the step 106S. The generated crack X reaches the p-type semiconductor layer 104. Thus, the crack X acts as a leakage path and the dark current is generated.

Figure 11B:
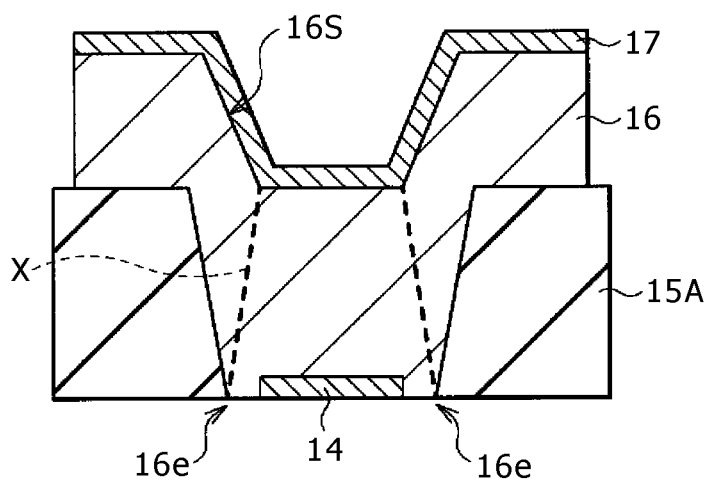
Figure 12:
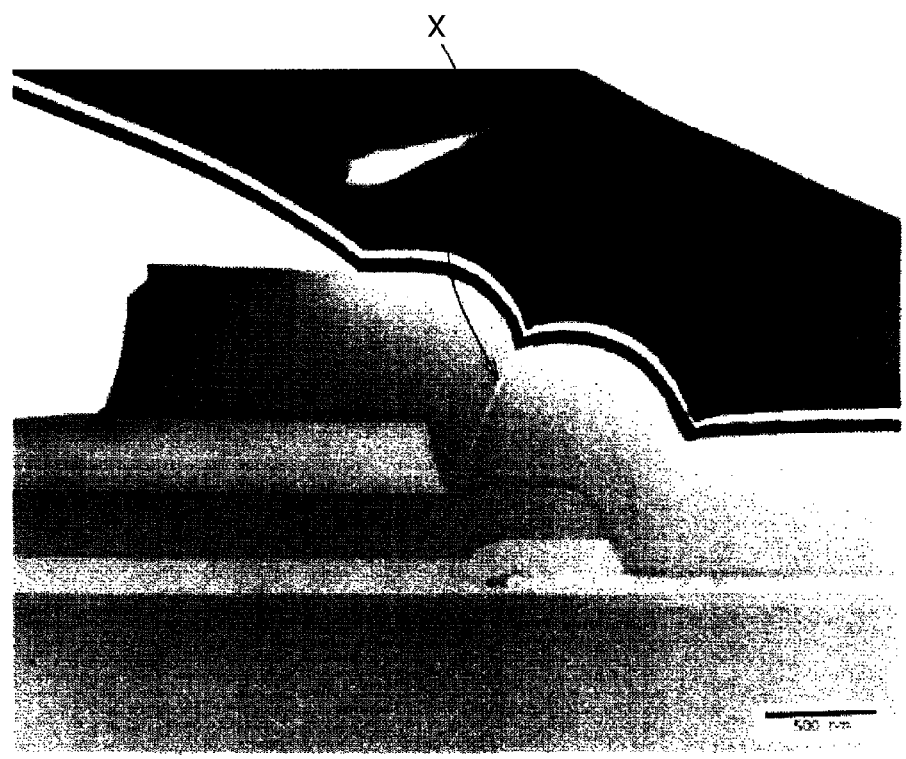
FIG. 12 is a photographic picture of a crack generated in the i-type semiconductor layer.

In contrast, in the present embodiment, the i-type semiconductor layer 16 has the corner part 16e as shown in FIG. 11B. Thus, the crack X is so generated that its start point (or end point) is the corner part 16e. Therefore, because the corner part 16e is not in contact with the p-type semiconductor layer 14, even when the crack X is generated attributed to the step structure 16S1, the crack X is led to the corner part 16e separate from the p-type semiconductor layer 14, so that acting of the crack X as a leakage path is suppressed. FIG. 12 is a picture obtained by photographing the actually generated crack X.

As described above, in the present embodiment, the i-type semiconductor layer 16 has the corner part 16e that is not in contact with the p-type semiconductor layer 14 in the PIN photodiode structure having the i-type semiconductor layer 16 between the p-type semiconductor layer 14 and the n-type semiconductor layer 17. Due to this feature, for example in the case in which the i-type semiconductor layer 16 has the step structure 16S1 dependent on the shape of the contact hole 150A, acting of a crack as a leakage path can be suppressed even when the crack is generated due to this step structure 16S1. This can suppress increase in the dark current attributed to the crack.

Modification examples (modification examples 1 to 4) of the photoelectric conversion element of the above-described embodiment will be described below. In the following description, the same constituent element as that in the photoelectric conversion element 10 according to the above-described embodiment is given the same numeral and description thereof is accordingly omitted.

Modification Examples 1 and 2

Figure 13:
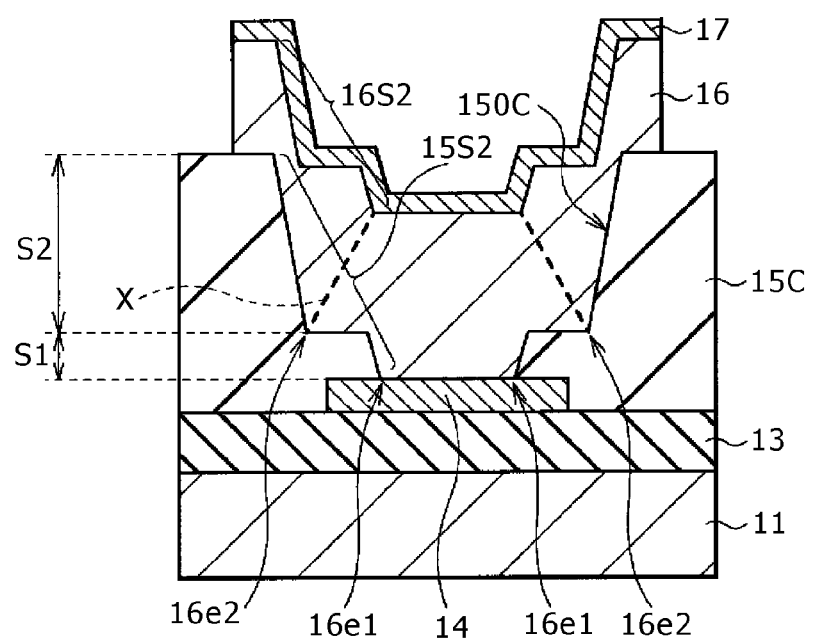
FIG. 13 is a sectional view showing the configuration of a photoelectric conversion element according to modification example 1.
Figure 14:
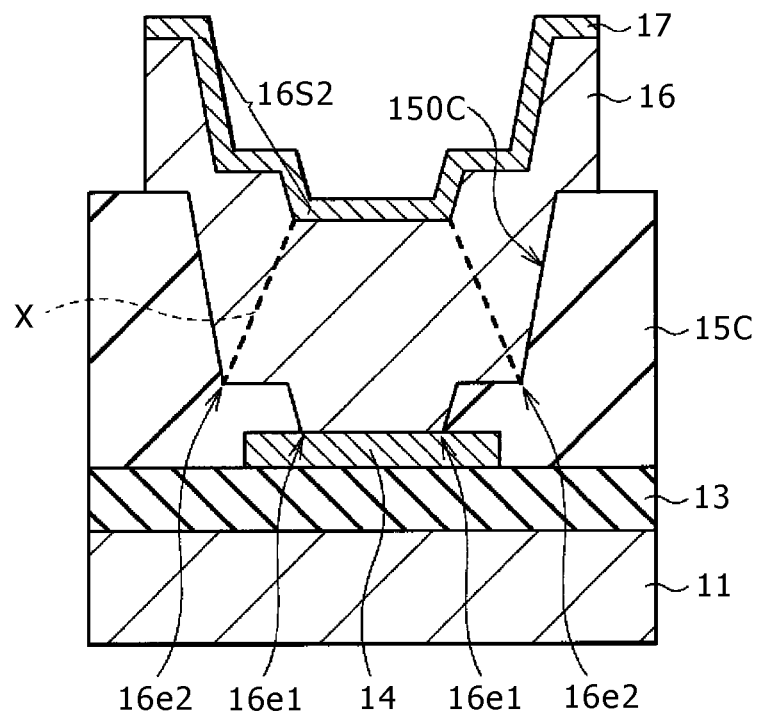
FIG. 14 is a sectional view showing the configuration of a photoelectric conversion element according to modification example 2.

FIG. 13 shows the sectional configuration of a photoelectric conversion element according to modification example 1. FIG. 14 shows the sectional configuration of a photoelectric conversion element according to modification example 2. These photoelectric conversion elements of modification examples 1 and 2 have the p-type semiconductor layer 14 over the substrate 11 with the intermediary of the insulating film 13 and the i-type semiconductor layer 16 is provided in a contact hole 150C of a first interlayer insulating film 15C, similarly to the photoelectric conversion element 10 of the above-described embodiment. On the i-type semiconductor layer 16, the n-type semiconductor layer 17 is provided in accordance with the surface shape of the i-type semiconductor layer 16. In such a configuration, the i-type semiconductor layer 16 has a corner part that is not in contact with the p-type semiconductor layer 14. For simplification, diagrammatic representation of the second interlayer insulating film 15B and the upper electrode 18 is omitted.

In modification examples 1 and 2, the contact hole 150C of the first interlayer insulating film 15C is formed by a two-step etching process. Specifically, the shape of a wall surface 15S2 of the contact hole 150C is a staircase shape having plural (in these examples, two) steps in a section along the direction perpendicular to the substrate surface. In other words, the wall surface 15S2 is a concave and convex surface having a corner (protrusion). Such a first interlayer insulating film 15C is obtained by stacking insulating films such as a $SiO_2$ layer and a $SiN_x$ layer similarly to the first interlayer insulating film 15A in the above-described embodiment.

The i-type semiconductor layer 16 is so provided as to be extended from the inside of the contact hole 150C in the first interlayer insulating film 15C to the top surface of the first interlayer insulating film 15C similarly to the above-described embodiment. Furthermore, the i-type semiconductor layer 16 is provided along the shape of the wall surface 15S2 of the contact hole 150C and thus has the step structure (16S2) dependent on the shape of the wall surface 15S2.

That is, in these modification examples 1 and 2, the i-type semiconductor layer 16 has plural corner parts 16e1 and 16e2 in association with the wall surface shape (staircase shape) of the above-described contact hole 150C. The corner part 16e1 is equal to the part corresponding to the end edge on the side of the substrate 11, and the corner part 16e2 is the protrusion part projecting toward the first interlayer insulating film 15C in the side surface of the i-type semiconductor layer 16. Furthermore, it is preferable that at least one step part of the respective step parts in this staircase shape be larger than the step part closest to the substrate. In these examples, the staircase shape has two step parts s1 and s2 in that order from the substrate side, and the step part s2 is larger than the step part s1. Due to this feature, the crack X is more easily led to the corner part 16e2, which is more separate from the p-type semiconductor layer 14.

The above-described corner parts 16e1 and 16e2 may be so made that only the corner part 16e2 is not in contact with the p-type semiconductor layer 14 and the corner part 16e1 is in contact with the p-type semiconductor layer 14 like in modification example 1 (FIG. 13). That is, the forming area of the p-type semiconductor layer 14 is larger than the lower-side opening of the contact hole 150C.

Alternatively, it is also possible that neither the corner part 16e1 nor 16e2 is contact with the p-type semiconductor layer 14 like in modification example 2 (FIG. 14). That is, the forming area of the p-type semiconductor layer 14 may be smaller than the lower-side opening of the contact hole 150C.

Figure 15A:
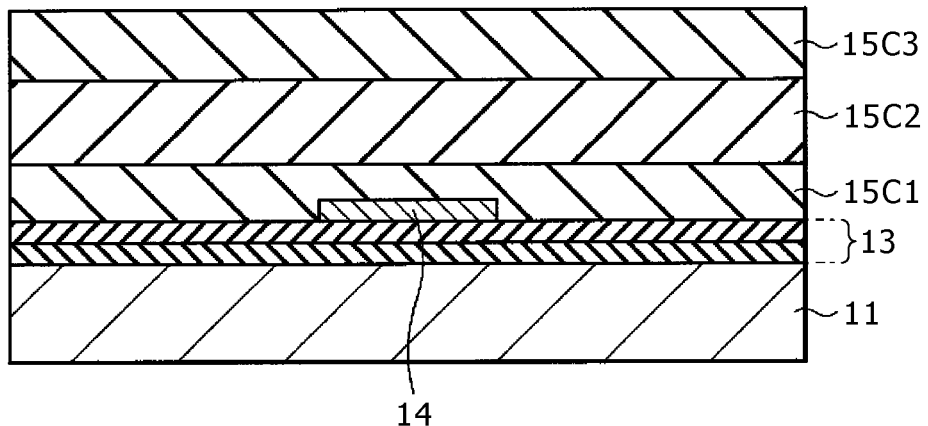
FIGS. 15A to 15C are sectional views for explaining a method for manufacturing the photoelectric conversion element shown in FIG. 13.
Figure 15B:
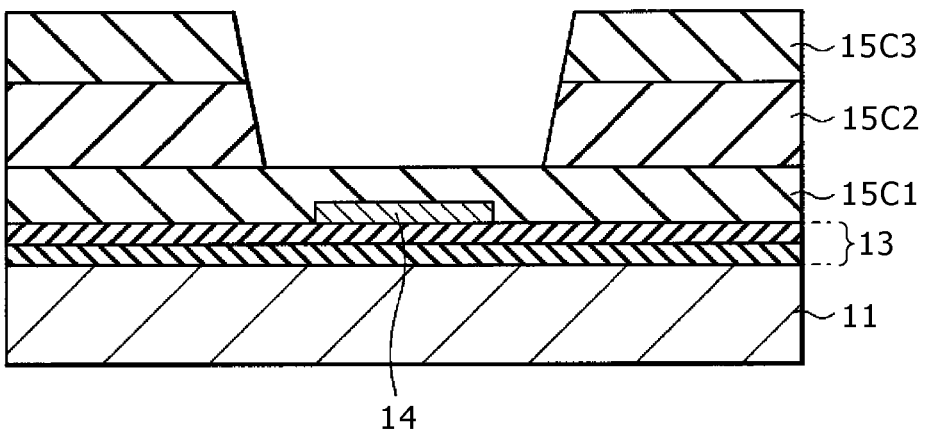
Figure 15C:
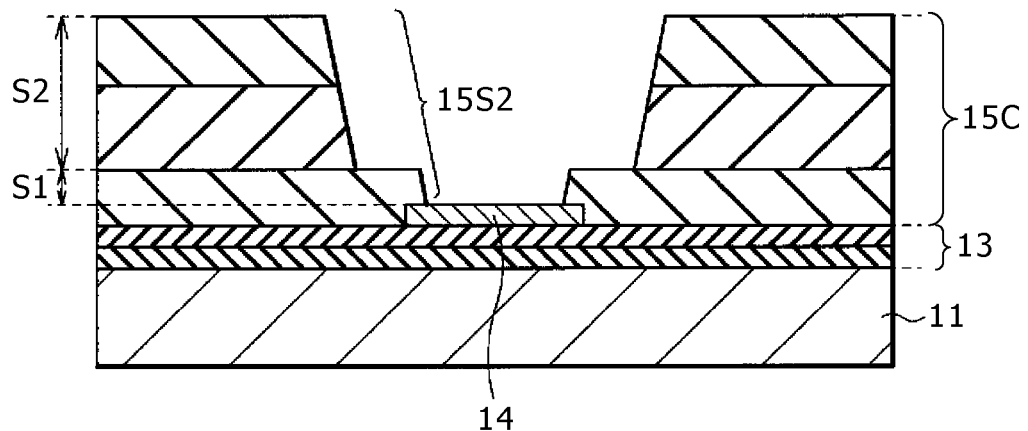

The above-described photoelectric conversion elements can be manufactured in the following manner for example. In the following description, the structure of modification example 1 is taken as an example. FIGS. 15A to 15C are sectional views for explaining a method for manufacturing the photoelectric conversion element according to modification example 1.

First, the p-type semiconductor layer 14 is formed in a selective area over the substrate 11 with the intermediary of the insulating film 13 similarly to the photoelectric conversion element of the above-described embodiment. Thereafter, as shown in FIG. 15A, the first interlayer insulating film 15C is formed on the insulating film 13 by depositing e.g. the $SiO_2$ layer 15C1, the SiNx layer 15C2, and the $SiO_2$ layer 15C3 in that order by e.g. CVD. This film deposition is so performed that the total film thickness of the SiNx layer 15C2 and the $SiO_2$ layer 15C3 is set larger than the film thickness of the $SiO_2$ layer 15C1 for example so that the step part s2 may become larger than the step part s1 on the substrate side in a later step. Of these layers, the $SiO_2$ layer 15C3 functions as an etching stopper layer in a later step of patterning the i-type semiconductor layer 16 and the n-type semiconductor layer 17.

Subsequently, as shown in FIG. 15B, upper two insulating films in the formed first interlayer insulating film 15C ($SiO_2$ layer 15C3 and SiNx layer 15C2) are subjected to dry etching. Subsequently, as shown in FIG. 15C, the lowermost insulating film in the formed first interlayer insulating film 15C ($SiO_2$ layer 15C1) is subjected to dry etching. Thereby, the contact hole 150C is formed. That is, in the present modification example, the contact hole 150C having the wall surface 15S2 with the above-described staircase shape is formed by a two-step etching process as described above.

Thereafter, similarly to the above-described embodiment, the i-type semiconductor layer 16 and the n-type semiconductor layer 17 (specifically, also the second interlayer insulating film 15B and the upper electrode 18) are formed to thereby complete the photoelectric conversion element shown in FIG. 13.

The i-type semiconductor layer 16 may have the plural corner parts 16e1 and 16e2 like in the above-described modification examples 1 and 2. If at least one corner part of them is not in contact with the p-type semiconductor layer 14, even when a crack is generated in the i-type semiconductor layer 16, this crack can be led to the corner part separate from the p-type semiconductor layer 14 and the occurrence of a leakage path can be suppressed similarly to the above-described embodiment. Thus, an advantageous effect equivalent to that of the above-described embodiment can be achieved. Furthermore, the crack can be led to the corner part more separate from the p-type semiconductor layer 14, of the plural corner parts. This can effectively suppress the influence of the crack.

Modification Examples 3 and 4

Figure 16:
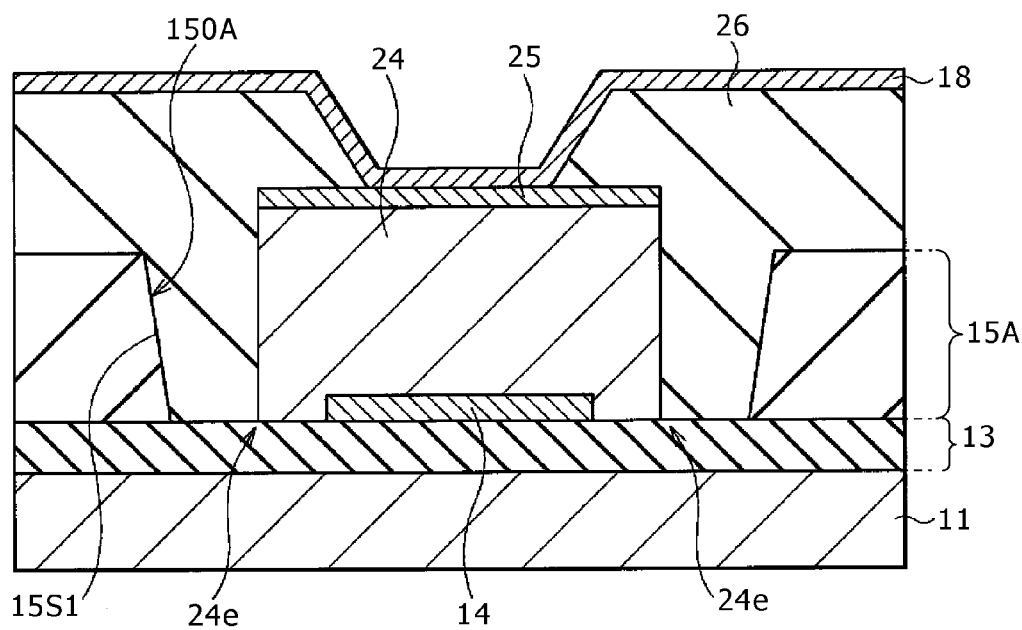
FIG. 16 is a sectional view showing the configuration of a photoelectric conversion element according to modification example 3.
Figure 17:
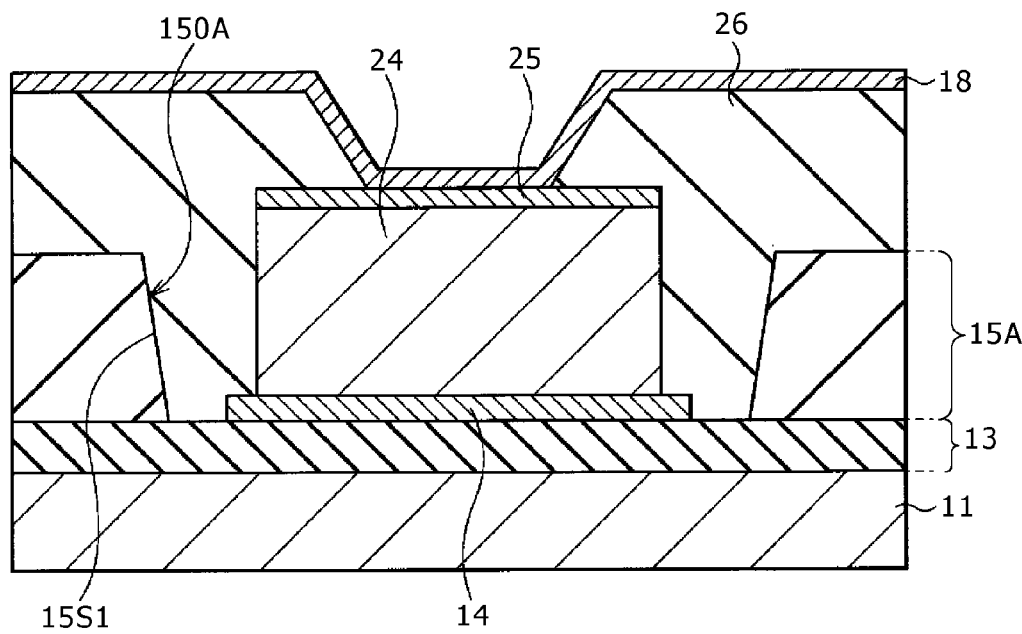
FIG. 17 is a sectional view showing the configuration of a photoelectric conversion element according to modification example 4.

FIG. 16 shows the sectional configuration of a photoelectric conversion element according to modification example 3. FIG. 17 shows the sectional configuration of a photoelectric conversion element according to modification example 4. These photoelectric conversion elements of modification examples 3 and 4 have the p-type semiconductor layer 14 over the substrate 11 and have an i-type semiconductor layer 24 in the contact hole 150A of the first interlayer insulating film 15A and an n-type semiconductor layer 25 on the i-type semiconductor layer 24, similarly to the photoelectric conversion element 10 of the above-described embodiment. Furthermore, the wall surface 15S1 of the contact hole 150A is a flat surface.

However, in modification examples 3 and 4, the i-type semiconductor layer 24 is so disposed in the contact hole 150A as to be separated from the wall surface 15S1 thereof differently from the above-described embodiment (and modification examples 1 and 2). That is, the i-type semiconductor layer 24 has a shape that does not depend on the shape of the wall surface 15S1 of the contact hole 150A, i.e. shape having no step structure. The n-type semiconductor layer 25 is provided on such an i-type semiconductor layer 24 in accordance with the surface shape of the i-type semiconductor layer 24. Furthermore, a protective film 26 composed of e.g. $SiO_2$ is so formed as to cover the side surfaces of these i-type semiconductor layer 24 and n-type semiconductor layer 25. The functions and constituent materials of the i-type semiconductor layer 24 and the n-type semiconductor layer 25 are the same as those of the above-described i-type semiconductor layer 16 and n-type semiconductor layer 17.

In these modification examples 3 and 4, the forming area of the p-type semiconductor layer 14 is not particularly limited. For example, like in modification example 3, the p-type semiconductor layer 14 may be smaller than the forming area of the i-type semiconductor layer 24 in the substrate surface (FIG. 16). In this case, the i-type semiconductor layer 24 has a corner part 24e that is not in contact with the p-type semiconductor layer 14.

Alternatively, like in modification example 4, the p-type semiconductor layer 14 may be larger than the forming area of the i-type semiconductor layer 24 in the substrate surface (FIG. 17). In this case, the i-type semiconductor layer 24 does not have the corner part 24e that is not in contact with the p-type semiconductor layer 14. However, there is no problem because a crack is not generated.

Figure 18A:
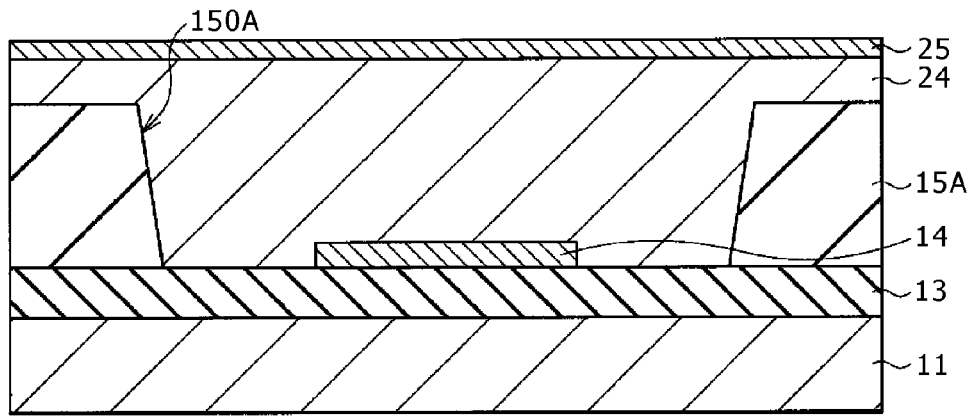
FIGS. 18A to 18C are sectional views for explaining a method for manufacturing the photoelectric conversion element shown in FIG. 16.
Figure 18B:
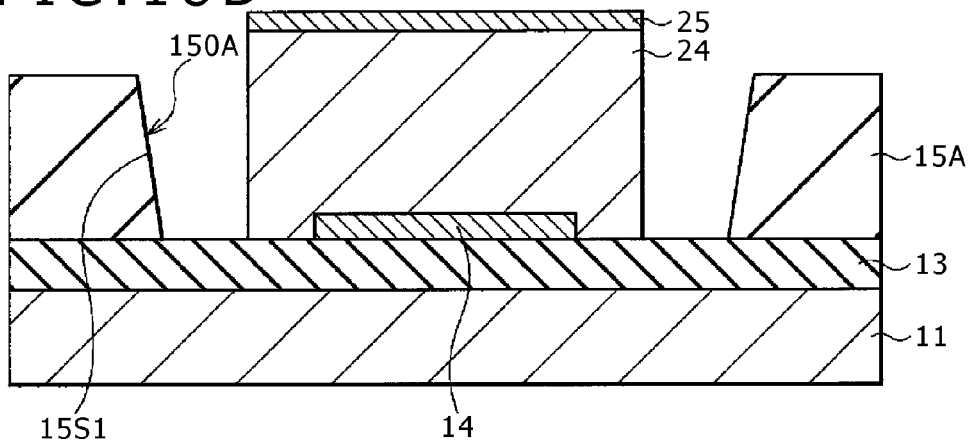
Figure 18C:
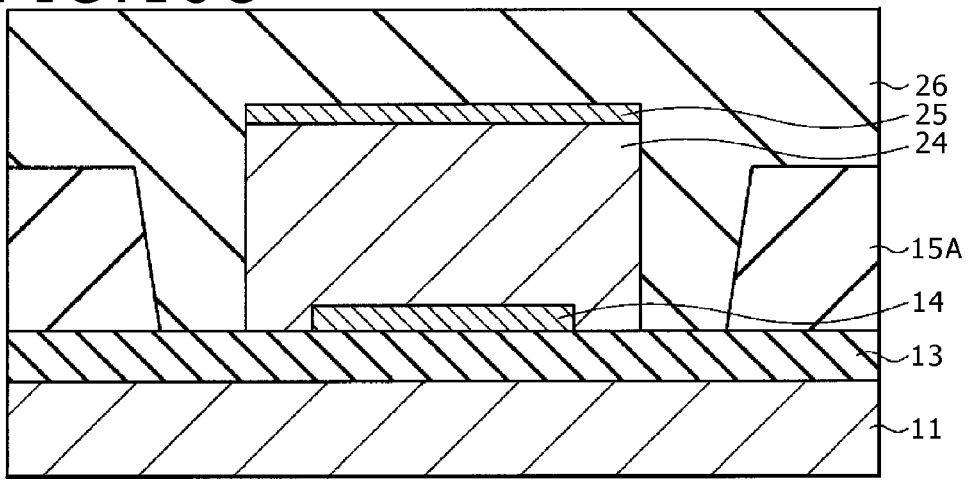

The above-described photoelectric conversion elements can be manufactured in the following manner for example. In the following description, the structure of modification example 3 is taken as an example. FIGS. 18A to 18C are sectional views for explaining a method for manufacturing the photoelectric conversion element according to modification example 3.

First, similarly to the photoelectric conversion element of the above-described embodiment, the p-type semiconductor layer 14 is formed in a selective area over the substrate 11 with the intermediary of the insulating film 13, and then the first interlayer insulating film 15A is deposited and the contact hole 150A is formed. Thereafter, as shown in FIG. 18A, the i-type semiconductor layer 24 and the n-type semiconductor layer 25 are deposited in that order over the first interlayer insulating film 15A by e.g. CVD in such a manner as to fill the contact hole 150A. Subsequently, as shown in FIG. 18B, the formed i-type semiconductor layer 24 and n-type semiconductor layer 25 are patterned by e.g. photolithography in such a manner that the i-type semiconductor layer 24 is separated from the wall surface 15S1 of the contact hole 150A. Subsequently, as shown in FIG. 18C, the protective film 26 is formed over the whole surface of the substrate 11. This protective film 26 is so formed as to fill the gap between the wall surface 15S1 and the i-type semiconductor layer 24.

Thereafter, a contact hole is formed in the area of the protective film 26 opposed to the n-type semiconductor layer 25. At last, the upper electrode 18 is formed similarly to the above-described embodiment, and thereby the photoelectric conversion element shown in FIG. 16 is completed.

Like in the above-described modification examples 3 and 4, the i-type semiconductor layer 24 may be so provided in the contact hole 150A as to be separated from the wall surface 15S1. Due to this feature, the i-type semiconductor layer 24 does not have a step structure like the above-described one and therefore the occurrence itself of a crack can be suppressed. Thus, a leakage path can be suppressed and an advantageous effect almost equivalent to that of the above-described embodiment can be achieved.

A photoelectric conversion device 2 (radiation imaging device 1) will be described below as an application example of the photoelectric conversion elements described in the above-described embodiment and modification examples 1 to 4. However, the application example of the above-described photoelectric conversion elements is not limited to such a radiation imaging device and the photoelectric conversion elements can be applied also to e.g. an optical touch sensor (touch panel). The following description will be made by taking, as an example, the photoelectric conversion element 10 described in the above-described embodiment as a representative of the above-described several photoelectric conversion elements.

[Configuration of Photoelectric Conversion Device 2]

Figure 19:
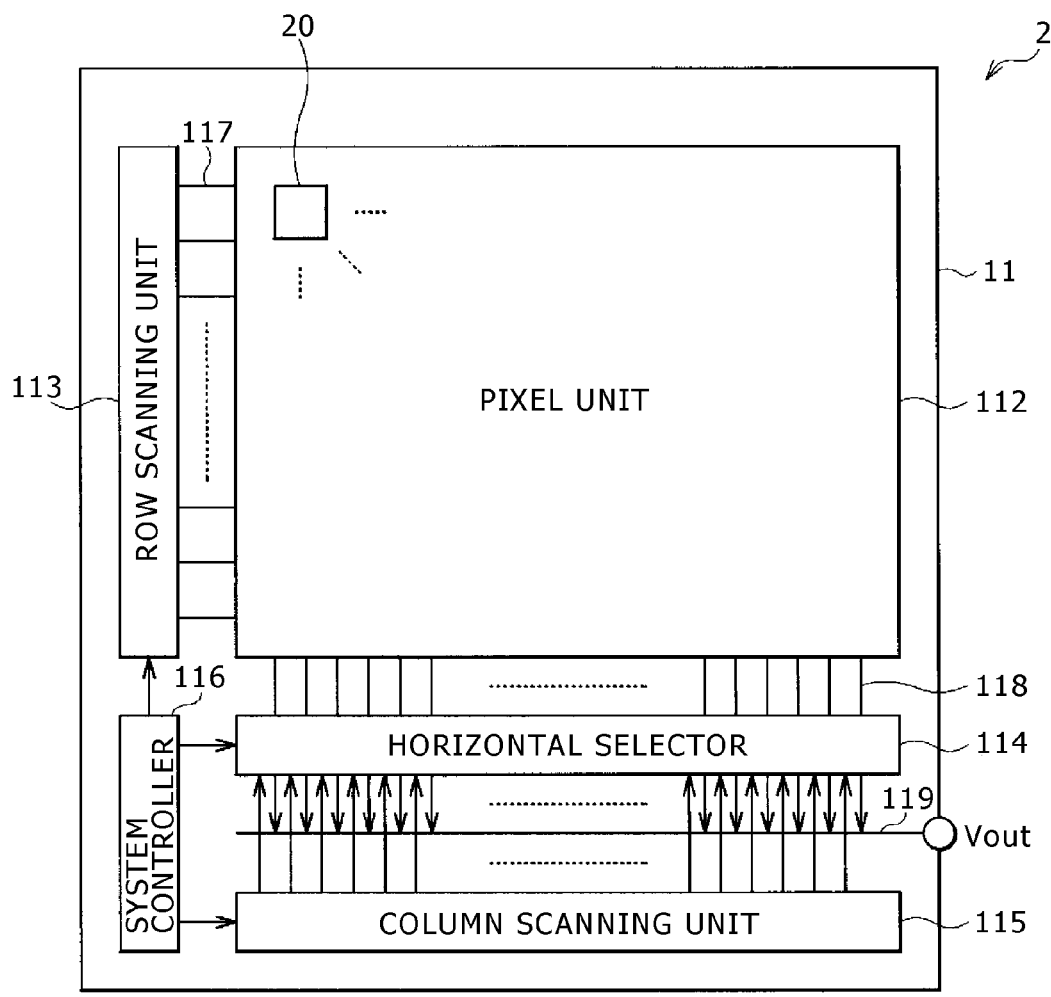
FIG. 19 is a system configuration diagram of a photoelectric conversion device according to an application example.
Figure 20:
FIG. 20 is a schematic diagram showing a radiation imaging device made by combination of the photoelectric conversion device and a wavelength converter.

FIG. 19 shows the system configuration of the photoelectric conversion device 2 in the radiation imaging device 1 according to the application example. The radiation imaging device 1 is obtained by providing a wavelength converter 40 on this photoelectric conversion device 2 (FIG. 20). It carries out wavelength conversion of radiation typified by α-rays, β-rays, γ-rays, and X-rays and reads information based on the radiation.

The wavelength converter 40 carries out wavelength conversion of the above-described radiation to the sensitivity region of the photoelectric conversion device 2. The wavelength converter 40 is a fluorescent body (e.g. scintillator) that converts radiation such as X-rays to visible light for example. Specifically, it is a component obtained by forming a fluorescent film of e.g. CsI, NaI, or CaF2 on the top surface of an organic planarized film or a planarized film composed of e.g. a spin-on-glass material.

The photoelectric conversion device 2 has a pixel unit 112 on a substrate 11. Around this pixel unit 112, a peripheral circuit part (drive part) composed of e.g. a row scanning unit (vertical driver) 113, a horizontal selector 114, a column scanning unit (horizontal driver) 115, and a system controller 116 is provided.

In the pixel unit 112, unit pixels 20 (hereinafter, often referred to simply as "pixel") each having a photoelectric converter that generates a photocharge with the amount of charge dependent on the amount of incident light and accumulates the photocharge inside are two-dimensionally arranged in a matrix. The photoelectric converter included in this unit pixel 20 is equivalent to the photoelectric conversion element 10 of the above-described embodiment and so forth. In the unit pixel 20, e.g. two interconnects (specifically, row selection line and reset control line) are provided for each pixel row as a pixel drive line 117 to be described later.

In the pixel unit 112, for the matrix pixel arrangement, the pixel drive line 117 is provided for each pixel row along the row direction (arrangement direction of the pixels on the pixel row) and a vertical signal line 118 is provided for each pixel column along the column direction (arrangement direction of the pixels on the pixel column). The pixel drive line 117 transmits a drive signal for signal readout from the pixel. In FIG. 19, the pixel drive line 117 is shown as one interconnect per one row. However, the number of pixel drive lines 117 per one row is not limited to one. One end of each of the pixel drive lines 117 is connected to the output terminal of the row scanning unit 113 corresponding to a respective one of the rows.

The row scanning unit 113 is configured with a shift register, an address decoder, and so forth, and is a pixel driver that drives the respective pixels of the pixel unit 112 e.g. on a row-by-row basis. The signals output from the respective unit pixels on the pixel row selectively scanned by the row scanning unit 113 are supplied to the horizontal selector 114 via the respective vertical signal lines 118. The horizontal selector 114 is configured with an amplifier, a horizontal selection switch, and so forth provided for each vertical signal line 118.

The column scanning unit 115 is configured with a shift register, an address decoder, and so forth, and scans and sequentially drives the respective horizontal selection switches of the horizontal selector 114. By this selective scanning by the column scanning unit 115, the signals of the respective pixels transmitted via the respective vertical signal lines 118 are sequentially output to a horizontal signal line 119 and transmitted to the external of the substrate 11 via this horizontal signal line 119.

The circuit part composed of the row scanning unit 113, the horizontal selector 114, the column scanning unit 115, and the horizontal signal line 119 is configured by using one or both of a circuit formed on the substrate 11 and an external control IC. Alternatively, this circuit part may be formed on another substrate connected to the substrate 11 by a cable or the like.

The system controller 116 receives a clock given from the external of the substrate 11, data to order the operating mode, and so forth, and outputs data of internal information of the photoelectric conversion device 2 and so forth. Furthermore, the system controller 116 has a timing generator that generates various kinds of timing signals and controls driving of the peripheral circuit part including the row scanning unit 113, the horizontal selector 114, the column scanning unit 115, and so forth based on the various kinds of timing signals generated by this timing generator.

(Configuration of Unit Pixel 20)

In the unit pixel 20, pixel transistors such as reset transistor, readout transistor, and row selection transistor are provided together with the photoelectric conversion element 10. These pixel transistors are each e.g. an N-channel field effect transistor and a silicon-based semiconductor such as microcrystalline silicon or polycrystalline silicon is used. Alternatively, an oxide semiconductor such as indium gallium zinc oxide (InGaZnO) or zinc oxide (ZnO) may be used.

Figure 21:
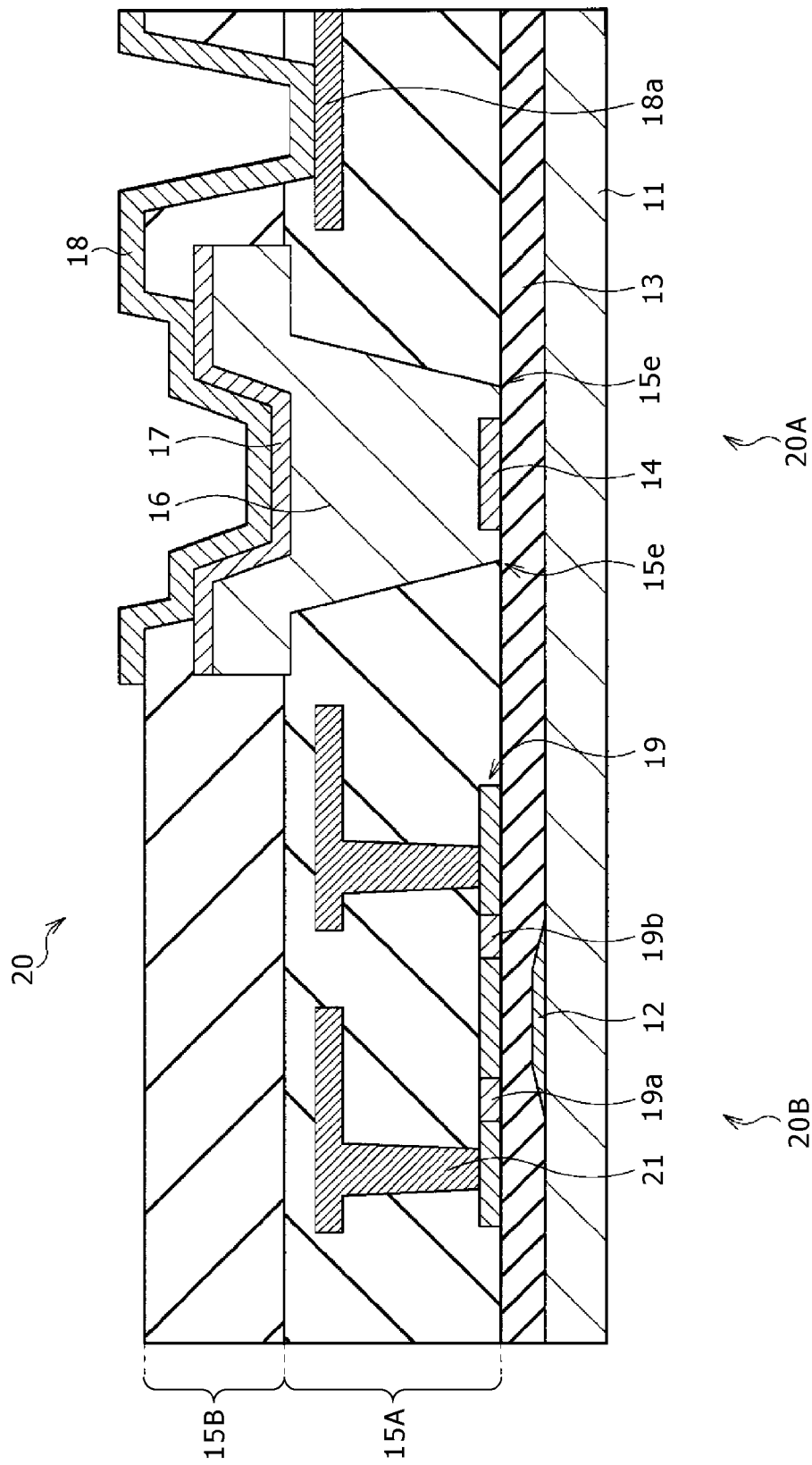
FIG. 21 is a sectional view showing a configuration in a unit pixel together with a transistor.

FIG. 21 shows the sectional structure of this unit pixel 20. As shown in FIG. 21, in the unit pixel 20, a photoelectric converter 20A as the photoelectric conversion element 10 and a transistor part 20B composed of a readout transistor and so forth are formed over the same substrate 11. Furthermore, the insulating film 13, the first interlayer insulating film 15A, and the second interlayer insulating film 15B are also each used as a common layer shared by the photoelectric converter 20A and the transistor part 20B.

The transistor part 20B has a gate electrode 12 composed of e.g. titanium (Ti), aluminum (Al), molybdenum (Mo), tungsten (W), or chromium (Cr) between the substrate 11 and the insulating film 13 (gate insulating film). On the insulating film 13, a semiconductor layer 19 including e.g. a p+ region, an i region, and an n+ region is formed. Furthermore, lightly doped drains (LDD) 19a and 19b are provided in the semiconductor layer 19 in order to reduce the leakage current. The semiconductor layer 19 is composed of e.g. microcrystalline silicon or polycrystalline silicon. This semiconductor layer 19 is connected to an interconnect layer 21 including a signal line for readout and various kinds of interconnects. In the same layer as the interconnect layer 21, an extraction electrode 18a connected to the upper electrode 18 of the photoelectric converter 20A is provided. These interconnect layer 21 and extraction electrode 18a are composed of e.g. Ti, Al, Mo, W, or Cr.

The present disclosure has been described above based on embodiment and modification examples. However, the present disclosure is not limited to the above-described embodiment and so forth and can be variously modified. For example, in the above-described embodiment and so forth, the p-type semiconductor layer, the i-type semiconductor layer, and the n-type semiconductor layer are stacked in that order from the substrate side. However, the semiconductor layers may be stacked in order of the n-type semiconductor layer, the i-type semiconductor layer, and the p-type semiconductor layer from the substrate side.

Furthermore, in the above-described modification examples 1 and 2, a structure in which the wall surface of the contact hole has two step parts is taken as an example. However, the number of step parts may be three or more. That is, a staircase shape with three or more steps may be formed by performing three-step or more-step etching in forming the contact hole. Also in this case, the contact hole is so formed that at least one step part larger than the step part closest to the substrate is formed.

In addition, it is unnecessary to include all of the respective layers described for the above-described embodiment and so forth, and conversely another layer may be included. For example, a protective film composed of e.g. SiN may be further formed on the upper electrode 18.

The present disclosure contains subject matter related to that disclosed in Japanese Priority Patent Application JP 2010-179555 filed in the Japan Patent Office on Aug. 10, 2010, the entire content of which is hereby incorporated by reference.

What is claimed is:

1. A photoelectric conversion element comprising:
    a first semiconductor layer (i) configured to exhibit a first conductivity type, (ii) disposed over a substrate, and (iii) configured as an electrode operable to read out a signal charge;
    a second semiconductor layer (i) configured to exhibit a second conductivity type, and (ii) disposed opposed to the first semiconductor layer; and
    a third semiconductor layer (i) disposed between the first and second semiconductor layers, (ii) configured to exhibit a substantially intrinsic conductivity type, and (iii) having at least one corner part that is not in contact with the first semiconductor layer,
    wherein,
        the first semiconductor layer is embedded within the third semiconductor layer so that a lowermost surface of the first semiconductor layer facing away from the second semiconductor layer is coplanar with a lowermost surface of the third semiconductor layer also facing away from the second semiconductor layer.

2. The photoelectric conversion element according to claim 1, further comprising:
    an interlayer insulating film configured to have a through-hole opposed to the first semiconductor layer and be provided over the substrate,
    wherein,
        the third semiconductor layer is extended from an inside of the through-hole to a top surface of the interlayer insulating film and has a step structure dependent on shape of a wall surface of the through-hole.

3. The photoelectric conversion element according to claim 2, wherein:
    a surface of the third semiconductor layer on a side of the interlayer insulating film is flat, and
    the corner part is an end edge part of the third semiconductor layer on a side of the substrate.

4. The photoelectric conversion element according to claim 2, wherein an opening of the through-hole on a side of the substrate is so provided as to surround an outside of an forming area of the first semiconductor layer in a direction along a substrate surface.

5. The photoelectric conversion element according to claim 2, wherein:
    a surface shape of the third semiconductor layer on a side of the interlayer insulating film is a staircase shape in a section along a direction perpendicular to a substrate surface, and
    the corner part is an end edge part of the third semiconductor layer on a side of the substrate or a protrusion part projecting toward the side of the interlayer insulating film.

6. The photoelectric conversion element according to claim 5, wherein at least one step part of a plurality of step parts in the staircase shape is larger than a step part closest to the substrate.

7. The photoelectric conversion element according to claim 1, further comprising:
    an interlayer insulating film configured to have a through-hole opposed to the first semiconductor layer and be provided over the substrate,
    wherein,
        the third semiconductor layer is so provided in the through-hole as to be separated from a wall surface of the through-hole.

8. The photoelectric conversion element according to claim 1, wherein the photoelectric conversion element is a positive-intrinsic-negative photodiode.

* * * * *